(12) United States Patent
Park

(10) Patent No.: US 6,579,372 B2
(45) Date of Patent: Jun. 17, 2003

(54) APPARATUS AND METHOD FOR DEPOSITING THIN FILM ON WAFER USING ATOMIC LAYER DEPOSITION

(75) Inventor: Young-Hoon Park, Kyungki-do (KR)

(73) Assignee: IPS, Ltd., Kyungki-do (KR)

( * ) Notice: Subject to any disclaimer, the term of this patent is extended or adjusted under 35 U.S.C. 154(b) by 0 days.

(21) Appl. No.: 09/848,579

(22) Filed: May 3, 2001

(65) Prior Publication Data
US 2002/0052097 A1 May 2, 2002

(30) Foreign Application Priority Data

Jun. 24, 2000 (KR) .................................. 2000-35100

(51) Int. Cl.[7] .............................................. L23C 16/00
(52) U.S. Cl. ...................................... 118/715; 137/255
(58) Field of Search ........................... 118/715; 137/255, 137/265

(56) References Cited

U.S. PATENT DOCUMENTS

| 4,798,809 A | * | 1/1989 | Hirooka et al. ............. 136/258 |
| 4,980,204 A | * | 12/1990 | Fujii et al. .................. 117/101 |
| 5,002,793 A | * | 3/1991 | Arai ............................ 118/626 |
| 5,091,207 A | * | 2/1992 | Tanaka ........................ 118/50 |
| 5,250,323 A | * | 10/1993 | Miyazaki ..................... 118/715 |
| 5,616,208 A | * | 4/1997 | Lee ............................. 118/715 |
| 5,637,153 A | * | 6/1997 | Niino et al. .................. 134/2 |
| 5,653,807 A | * | 8/1997 | Crumbaker ................. 118/715 |
| 5,769,950 A | * | 6/1998 | Takasu et al. ............... 118/715 |
| 5,849,092 A | * | 12/1998 | Xi et al. ...................... 134/1.1 |
| 5,853,936 A | * | 12/1998 | Segi et al. ................... 399/165 |
| 5,993,555 A | * | 11/1999 | Hamilton .................... 118/715 |
| 6,004,618 A |   | 12/1999 | Mizutani et al. |
| 6,042,652 A |   | 3/2000 | Hyun et al. |
| 6,197,683 B1 |   | 3/2001 | Kang et al. |
| 6,328,043 B1 | * | 12/2001 | Kim et al. .................. 134/22.1 |
| 2001/0045187 A1 | * | 11/2001 | Uhlenbrock ................. 118/715 |
| 2002/0007790 A1 | * | 1/2002 | Park ............................ 118/715 |

FOREIGN PATENT DOCUMENTS

| JP | 2230722 | 9/1990 |
| JP | 11269652 | 10/1999 |
| JP | 11172438 | 3/2001 |

* cited by examiner

Primary Examiner—Jeffrie R. Lund
(74) Attorney, Agent, or Firm—Cantor Colburn LLP

(57) ABSTRACT

An atomic layer deposition (ALD) thin film deposition apparatus including a reactor in which a wafer is mounted and a thin film is deposited on the wafer, a first reaction gas supply portion for supplying a first reaction gas to the reactor, a second reaction gas supply portion for supplying a second reaction gas to the reactor, a first reaction gas supply line for connecting the first reaction gas supply portion to the reactor, a second reaction gas supply line for connecting the second reaction gas supply portion to the reactor, a first inert gas supply line for supplying an inert gas from an inert gas supply source to the first reaction gas supply line, a second inert gas supply line for supplying the inert gas from the inert gas supply source to the second reaction gas supply line, and an exhaust line for exhausting the gas from the reactor.

19 Claims, 8 Drawing Sheets

APPARATUS AND METHOD FOR DEPOSITING THIN FILM ON WAFER USING ATOMIC LAYER DEPOSITION

BACKGROUND OF THE INVENTION

1. Field of the Invention

The present invention relates to an atomic layer deposition (ALD) thin film deposition apparatus for depositing a thin film on a semiconductor, for example, on a semiconductor wafer, and a method thereof.

2. Description of the Related Art

A thin film deposition apparatus forms a predetermined thin film on a wafer by supplying reaction gases to the wafer received within a reactor. This thin film deposition apparatus includes a chemical vapor deposition (CVD) thin film deposition apparatus, an atomic layer epitaxy (ALE) thin film deposition apparatus, and others, and has been applied to various fields for manufacturing semiconductor devices.

Thin film deposition apparatuses have been continuously improved to make a highly-integrated chip and increase the efficiency of management and productivity.

SUMMARY OF THE INVENTION

An objective of the present invention is to provide an ALD thin film deposition apparatus and a method thereof, by which a thin film having excellent electrical characteristics, a high purity, in which impurities are removed as much as possible, and an excellent step coverage can be formed, and the efficiency and productivity of management can be improved.

Another objective of the present invention is to provide an ALD thin film deposition apparatus including an exhaust line for continuously maintaining a desired process pressure before and after depositing a thin film, and pumping a reactor, and a deposition method.

To achieve the above objectives, the present invention provides an atomic layer deposition (ALD) thin film deposition apparatus including: a reactor in which a wafer is mounted and a thin film is deposited on the wafer; a first reaction gas supply portion for supplying a first reaction gas to the reactor; a second reaction gas supply portion for supplying a second reaction gas to the reactor; a first reaction gas supply line for connecting the first reaction gas supply portion to the reactor; a second reaction gas supply line for connecting the second reaction gas supply portion to the reactor; a first inert gas supply line for supplying an inert gas from an inert gas supply source to the first reaction gas supply line; a second inert gas supply line for supplying the inert gas from the inert gas supply source to the second reaction gas supply line; and an exhaust line for exhausting the gas from the reactor.

To achieve the above objectives, the present invention provides an ALD thin film deposition method including: mixing a first reaction gas and an inert gas to form a first mixture gas; supplying the first mixture gas to an upper surface of a wafer received in a reactor; mixing a second reaction gas and the inert gas to form a second mixture gas; and supplying the second mixture gas to edges of the wafer.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 1:
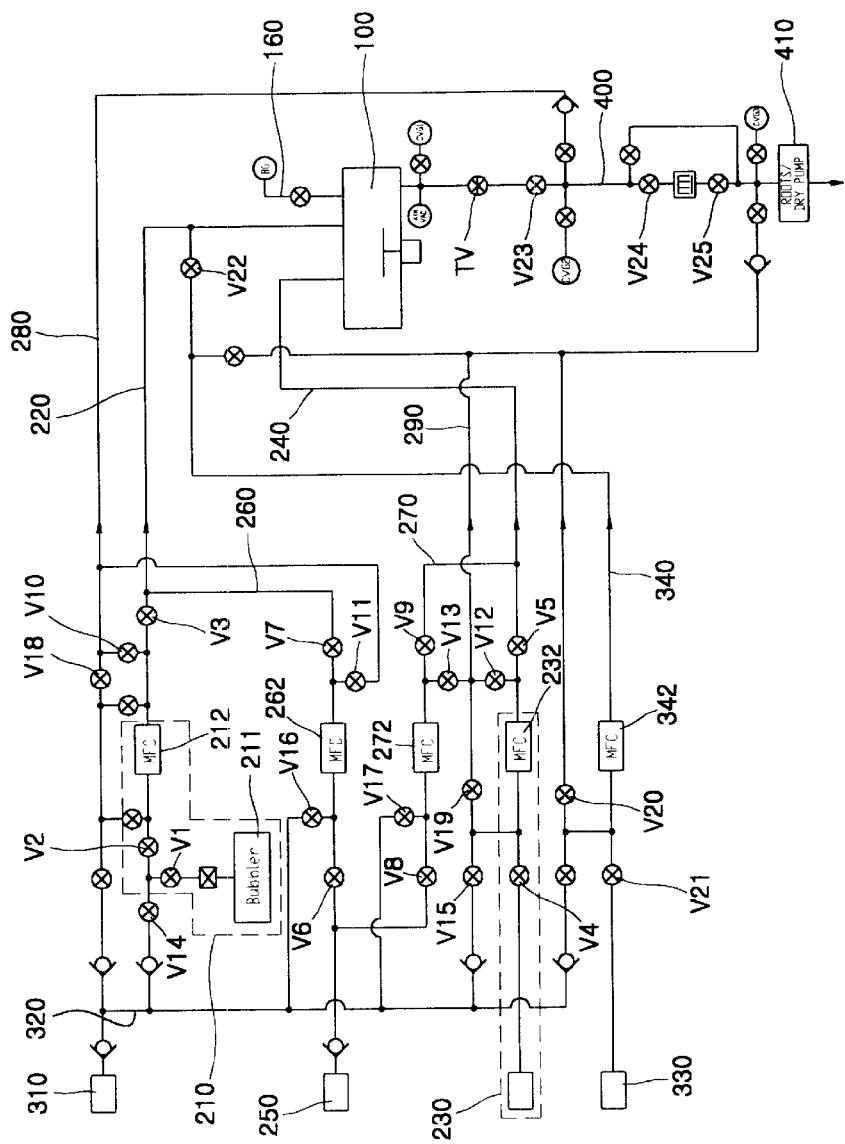
FIG. 1 is a schematic diagram of an atomic layer deposition (ALD) thin film deposition apparatus according to a first embodiment of the present invention.

FIG. 1 shows an atomic layer deposition (ALD) thin film deposition apparatus that can deposit a TiN or TaN thin film on a wafer. Deposition of a TiN thin film will now be described as an example. In order to form a TiN thin film, $TiCl_4$ is used as a first reaction gas, $NH_3$ is used as a second reaction gas, and Ar is used as an inert gas.

Referring to FIG. 1, an ALD thin film deposition apparatus includes a reactor 100 for receiving a wafer and depositing a thin film on the wafer, a gas jungle (this term was made by the present inventor to describe complicatedly-connected gas lines) for supplying a reaction gas to the reactor 100, and an exhaust line 400 for exhausting the gas within the reactor 100 to the outside.

Figure 2:
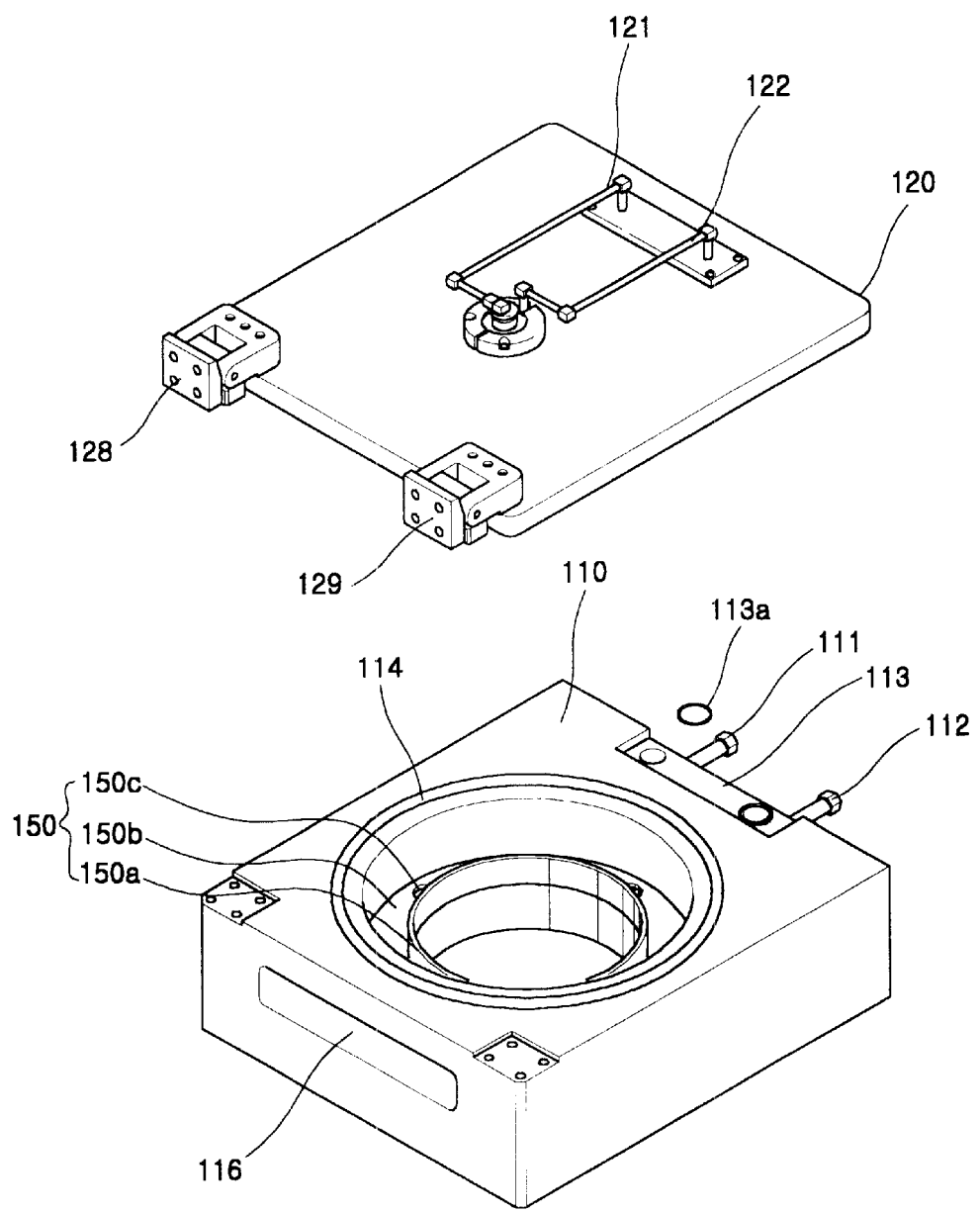
FIG. 2 is an exploded perspective view of a reactor in the ALD thin film deposition apparatus of FIG. 1.
Figure 3:
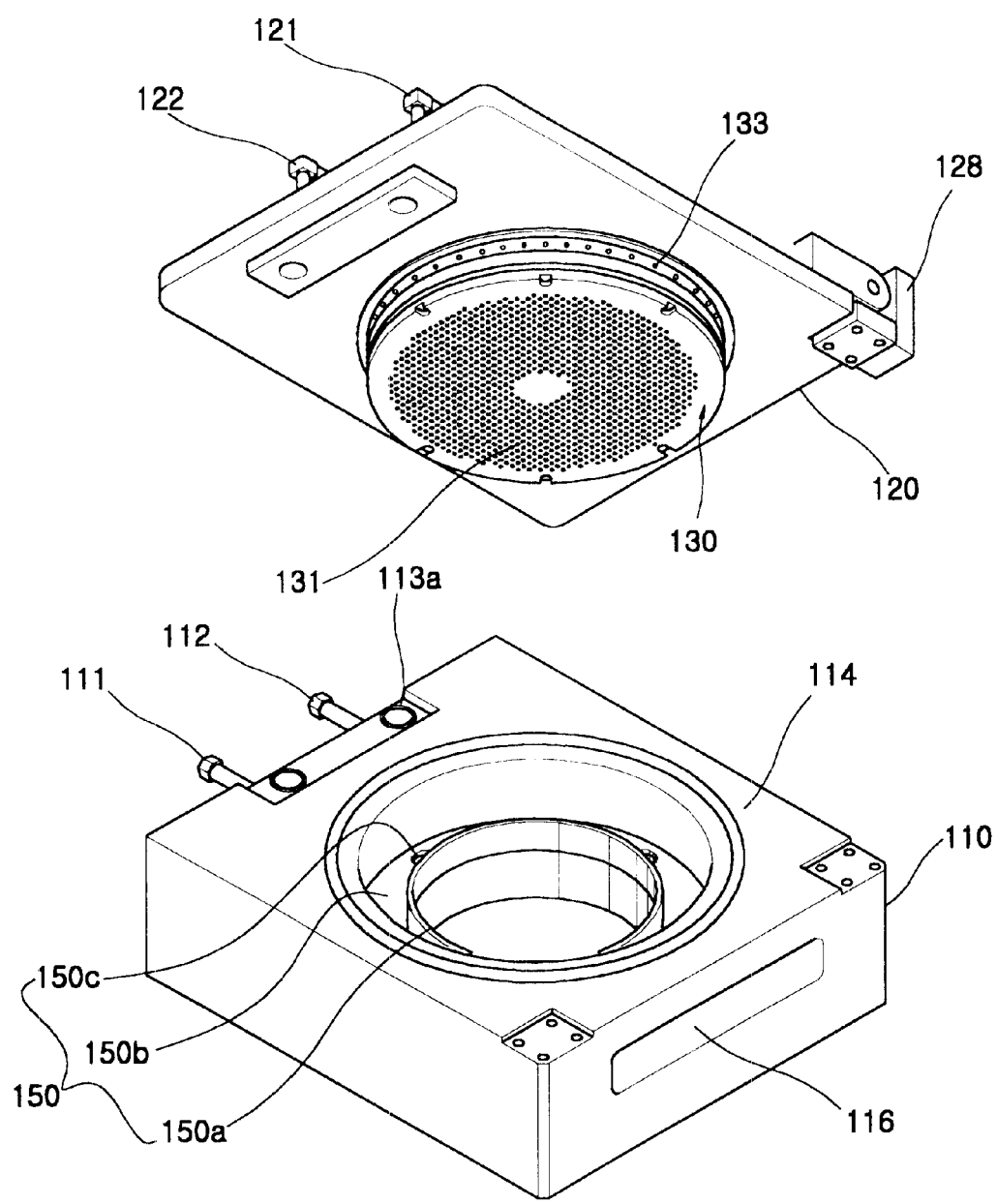
FIG. 3 is an exploded perspective view of a shower head plate and a diffusion plate in the reactor of FIG. 2.
Figure 4:
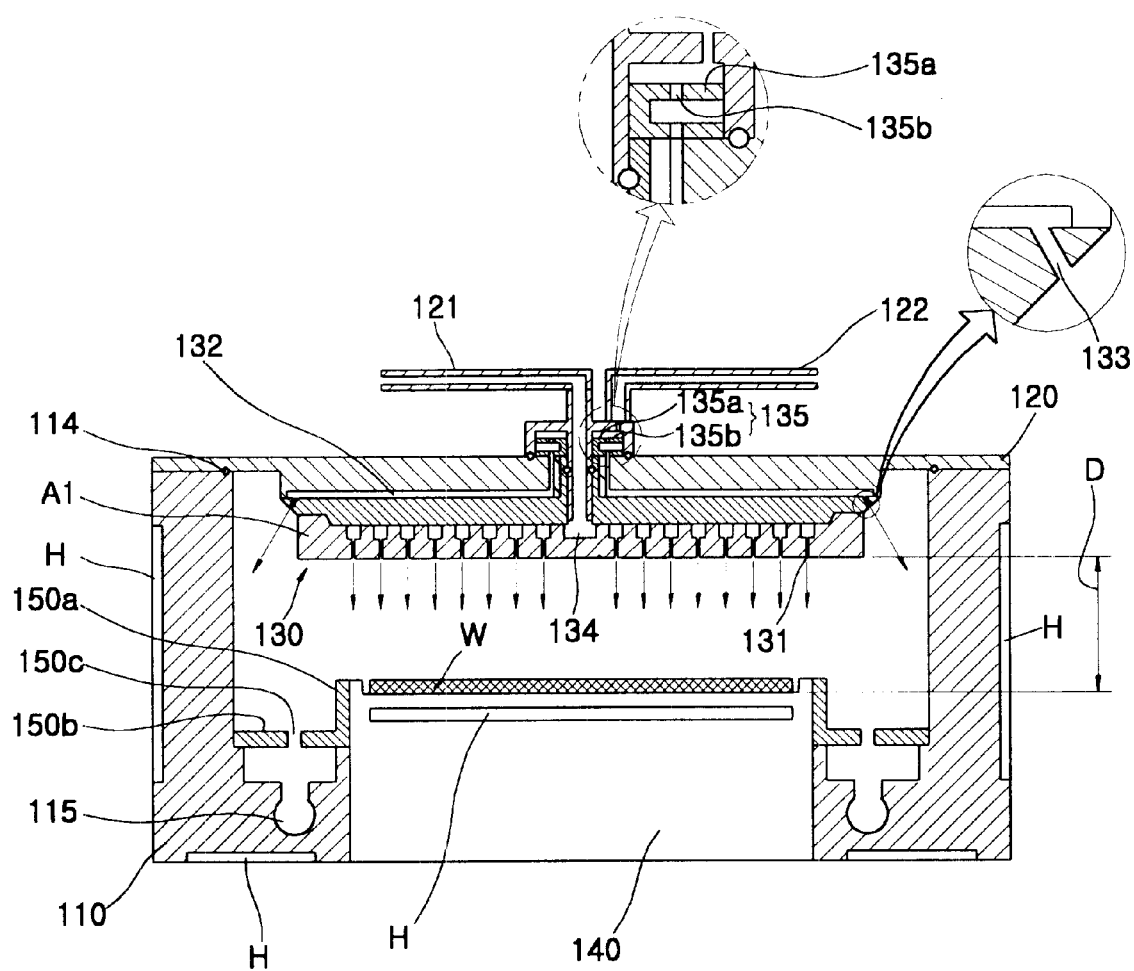
FIG. 4 is a cross-sectional view of the reactor of FIG. 2.
Figure 5:
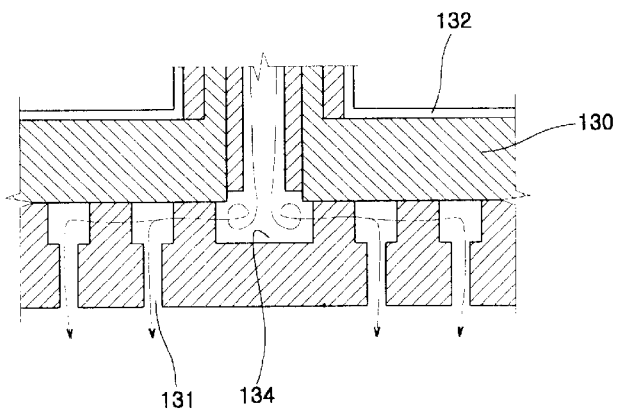
FIG. 5 is a magnified cross-sectional view of the first mixing unit of the reactor of FIG. 4.

FIG. 2 is an exploded perspective view of a reactor in the ALD thin film deposition apparatus of FIG. 1. FIG. 3 is an exploded perspective view of the reactor of FIG. 2, in which a shower head plate is separated from a diffusion plate. FIG. 4 is a cross-sectional view of the reactor of FIG. 2, and FIG. 5 is a magnified cross-sectional view of the first mixing unit of the reactor of FIG. 4.

Referring to FIGS. 2, 3, 4 and 5, the reactor 100 includes a reactor block 110 on which a wafer is placed, a shower head plate 120 coupled to the reactor block 110 using hinges 128 and 129, a diffusion plate 130 installed on the shower head plate 120 for spraying a reaction gas and/or inert gas, and a wafer block 140 installed within the reactor block 110, on which a wafer is seated.

First and second connection lines 121 and 122 are installed on the shower head plate 120, and are connected to first and second connection pipes 111 and 112 to be described later.

The first and second connection pipes 111 and 112 are installed on the reactor block 110, and connected to the first and second connection lines 121 and 122, respectively, via a connecting portion 113. An O-ring 113a is installed on the connecting portion 113, and connects the first and second connection pipes 111 and 112 to the first and second connection lines 121 and 122 so that they are sealed when the shower head plate 120 covers the reaction block 110. When the shower head plate 120 is rotated and separated from the reaction block 110, the first and second connection pipes 111 and 112 are separated from the first and second connection lines 121 and 122.

At least two exhaust holes 117 and 118 for exhausting introduced inert gases and/or reaction gases are formed to be symmetrical to each other on the bottom of the reactor block 110. A main O-ring 114 is installed on the upper surface of the reactor block 110, so that the reactor block 110 and the shower head plate 120 are securely sealed when the shower head plate 120 is covered.

The shower head plate 120 covers the reactor block 110, so that a predetermined pressure is constantly maintained within the reactor block 110. Also, the shower head plate 120 covers the reactor block 110 so that the diffusion plate 130 is placed within the reactor block 110.

The diffusion plate 130, which sprays a gas during a thin film deposition process, has a plurality of spray holes 131, which are connected to the first connection line 121, and spray a first reaction gas and/or inert gas onto the wafer w, and a plurality of nozzles 133, which are connected to a passage 132 leading to the second connection line 122 and face the inner side surface of the reactor block 110 to spray a second reaction gas and/or inert gas onto the edges of the wafer w.

A first mixing portion 134 for evenly mixing a first reaction gas and an inert gas and flowing the mixture to the spraying hole 131 is formed at the center of the inside of the diffusion plate 130, as shown in FIGS. 4 and 5. The first reaction gas and the inert gas flowing via the connection line 121 are swirled and mixed, and then diffused and evenly sprayed onto the wafer via all of the spray holes 131.

Spray holes 131 are not formed below the first mixing portion 134 in the diffusion plate 130, as shown in FIGS. 3 and 5. Preferably, the entire area Al of the diffusion plate 130 having the spray holes 131 is larger than the area of the wafer w, so that a gas can be evenly spayed over the entire surface of the wafer.

Preferably, the diameter of the spray holes 131 is between 1 mm and 2.5 mm. This diameter, which is obtained by several experiments, allows an excellent thin film to be formed on the wafer w. Also, the number of spray holes 131 is about 100 to 1000 according to their diameter. In this embodiment, more than 160 spray holes are formed. The cross-section of the diffusion plate 130 between spray holes 131 has the shape of upside-down T, so that thermal energy from the wafer block 140 is smoothly transmitted to the shower head plate 120 in order to prevent the diffusion plate 130 from being overheated.

The nozzles 133 lead to the passages 132 radially formed from a second mixing portion 135, and are slanted toward the inner side surface of the reactor block 110, as shown in FIG. 4. Preferably, there are 30–100 nozzles 133. In the present embodiment, 48 nozzles are formed.

The second mixing portion 135 for evenly mixing a second reaction gas and an inert gas is formed between the second connection line 122 and the shower head plate 120, as shown in FIG. 4. The second mixing portion 135 has a structure in which a hole 135b is formed through a partition 135a.

The wafer block 140, on which the wafer w is to be seated, is installed within the reactor block 110. A heater H is installed in the wafer block 140 to heat and maintain the wafer block 140 to a predetermined temperature during deposition.

The interval (D) between the diffusion plate 130 and the wafer block 140 is in the range of 20 mm to 50 mm.

Figure 6:
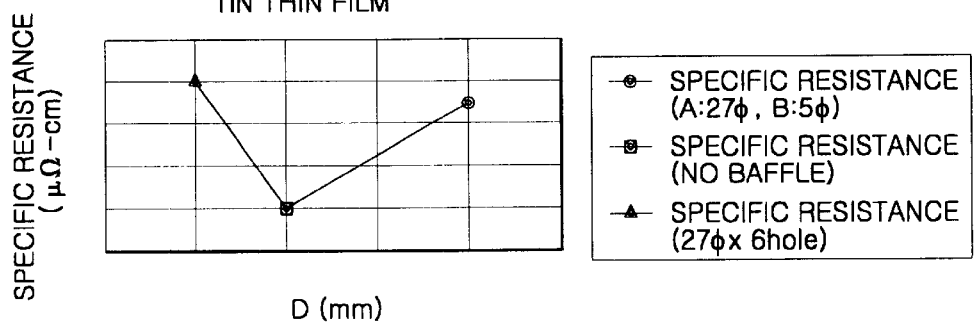
FIG. 6 is a graph showing the relationship between an interval (D) and a specific resistance while a thin film is deposited.

Referring to FIG. 6, which is a graph showing the interval (D) and specific resistance during deposition of a thin film, it can be seen that the specific resistance is the lowest when the interval (D) between the diffusion plate 130 and the wafer block 140 is 30 mm. However, when other conditions, for example, the types and amounts of first and second reaction gases, the temperature of a wafer block, or the like, were changed, specific resistance values were low at the intervals D within a range of about 20 to 50 mm, and it can be concluded that the interval D is an important structural property in forming an excellent thin film.

The interval within this range is compared to a conventional chemical vapor deposition (CVD) reactor in which the interval between a diffraction plate to which a reaction gas is sprayed and a wafer block on which a wafer is seated is about 50 to 100 mm. In the present invention, since the interval D is smaller than that in the prior art, a dense first reaction gas layer is formed on a wafer w by the pressure of a first reaction gas and/or inert gas sprayed from the spraying holes 131. The first reaction gas layer reacts with a second reaction gas flowed in later, so that a thin film having a higher purity and an excellent electrical property can be formed.

A pumping baffle 150 is installed around the wafer block 140. The pumping baffle 150 is made up of a sidewall 150a installed on the lateral side of the wafer block 140, and a bottom wall 150b through which symmetrical holes 150c are formed. A donut-shaped pumping pot 115 connected to an exhaust line is formed below the bottom wall 150b of the pumping baffle 150, that is, on the bottom of the reactor block 110.

The sidewall 150a and the bottom wall 150b of the pumping baffle 150 provide a space in which a second reaction gas and/or inert gas sprayed onto the inner side surface of the reactor block 110 can more evenly react to the first reaction gas layer formed on the wafer w. A process product generated during deposition of a thin film, and gases not used during deposition of a thin film are slipped through the hole 150c. These gases pass through the exhaust holes 117 and 118, and are exhausted via the pumping pot 115.

When a thin film is deposited, the pressure within a reactor must be maintained to be 1 to 10 torr. In order to observe and control this pressure, a pressure measuring portion 160 must be installed within the reactor.

The reactor 100 has heaters (H) formed inside and outside to heat the reactor when a thin film is deposited. In this embodiment, when a TiN thin film is deposited, the temperature of the inner surface of the reactor block 110 must be kept at about 120 to 200° C., and the temperature of the diffusion plate 130 must be kept at about 150 to 260° C. Also, the wafer block 140 must be kept at a temperature of about 425 to 650° C., and the pumping baffle 150 must be kept at a temperature of about 150 to 230° C. The temperature of a vat valve 101 between the reactor 100 and a transfer module 102 for supplying and transferring a wafer w must be maintained at about 140 to 170° C.

In the reactor 100, in a state where the wafer w transferred via the wafer transfer hole 116 is seated on the wafer block 140 and heated to a predetermined temperature, a first reaction gas and/or inert gas is sprayed onto the wafer w through the spray holes 131 of the diffusion plate 130 along a route from the first connection pipe 111 to the first connection line 121, and a second reaction gas and/or inert gas is sprayed onto the edges of the wafer w through the nozzles 133 along a route from the second connection pipe 112, to the second connection line 122, and to the passage 132. The first and second reaction gases are used to form a thin film on the wafer w, and process products or gases not used for depositing a thin film are exhausted to the outside through the exhaust holes 117 and 118 and the pumping pot 115.

As shown in FIG. 1, the gas jungle includes a first reaction gas supply portion 210 for supplying a reaction gas to the reactor 100, and a second reaction gas supply portion 230 for supplying a second gas to the reaction gas 100.

The first reaction gas supply portion 210 is connected to the reactor 100 via a first reaction gas supply line 220, and the second reaction gas supply portion 230 is connected to the reactor 100 via a second reaction gas supply line 240.

A first inert gas supply line 260 through which an inert gas supplied from the inert gas supply source 250 flows is connected to the first reaction gas supply line 220, and a second inert gas supply line 270 through which an inert gas supplied from the inert gas supply source 250 flows is connected to the second reaction gas supply line 240.

The first reaction gas supply portion 210 includes a bubbler 211 for gasifying a first reaction material, a first reaction gas mass flow controller (MFC) 212 for controlling the flow of a first reaction gas supplied from the bubbler 211, and first and second valves V1 and V2 installed on the line between the bubbler 211 and the first reaction gas MFC 212 for allowing or blocking the flow of a first reaction gas.

A third valve V3 for allowing or blocking the flow of the first reaction gas controlled by the first reaction gas MFC 212 is installed on the first reaction gas supply line 220.

The second reaction gas supply portion 230 includes a fourth valve V4 for allowing or blocking the flow of a second reaction gas, and a second reaction gas MFC 232 for controlling the flow of a second reaction gas passed through the fourth valve V4. A fifth valve V5 for allowing or blocking the flow of a second reaction gas controlled by the second reaction gas MFC 232 is installed on the second reaction gas supply line 240.

A sixth valve V6 for allowing or blocking the flow of a supplied inert gas, a first inert gas MFC 262 for controlling the flow of an inert gas passed through the sixth valve V6, and a seventh valve V7 for allowing or blocking the flow of an inert gas controlled by the first inert gas MFC 262, are installed on the first inert gas supply line 260.

An eighth valve V8 for allowing or blocking the flow of a supplied inert gas, a second inert gas MFC 272 for controlling the flow of an inert gas passed through the eighth valve V8, and a ninth valve V9 for allowing or blocking the flow of an inert gas controlled by the second inert gas MFC 272, are installed on the second inert gas supply line 270.

Here, the gas jungle includes a first bypass line 280 for allowing a first reaction gas and/or inert gas to flow directly to the exhaust line 400 without passing through the reactor 100, and a second bypass line 290 for allowing a second reaction gas and/or inert gas to flow directly to the exhaust line 400 without passing through the reactor 100.

The first bypass line 280 has a tenth valve V10 connected to the line between the first reaction gas MFC 212 and the third valve V3 for allowing or blocking the flow of a first reaction gas to the exhaust line 400, and an eleventh valve V11 connected to the line between the first inert gas MFC 262 and the seventh valve V7 for allowing or blocking the flow of an inert gas to the exhaust line 400.

The second bypass line 290 has a twelfth valve V12 connected to the line between the second reaction gas MFC 232 and the fifth valve V5 for allowing or blocking the flow of a second reaction gas to the exhaust line 400, and a thirteenth valve V13 connected to the line between the second inert gas MFC 272 and the ninth valve V9 for allowing or blocking the flow of an inert gas to the exhaust line 400.

The first and second bypass lines 280 and 290 are adopted to purge the lines within the gas jungle, when a small amount of gas flowed in while a material of a first or second reaction gas or an inert gas is exchanged must flow directly to the exhaust line 400 without passing by the reactor 100, when a contaminating source is generated within the lines, or when a new gas jungle is replaced.

As described above, first and second reaction gases, air or contaminating sources remaining within lines are purged directly to the exhaust line 400 via the first and second bypass lines 280 and 290 by an inert gas, so that the reactor 100 can be prevented from being contaminated. Thus, the first and second bypass lines 280 and 290 are not used in processes for depositing a thin film, but used only in specific cases.

The gas jungle further includes a separate inert gas supply line 320 for supplying an inert gas from the inert gas supply source 310 in order to purge gases and/or contaminating sources remaining in the lines. The inert gas supply line 320 is organically connected to the first and second reaction gas supply portions 210 and 230, the first and second inert gas supply lines 260 and 270, the first and second bypass lines 280 and 290, and the exhaust line 400. The inert gas supply line 320 is connected to gas lines fundamentally required by a process, via a fourteenth valve V14 for allowing or blocking the flow of an inert gas to the first reaction gas supply portion 210, a fifteenth valve V15 for allowing or blocking the flow of an inert gas to the second reaction gas supply portion 230, a sixteenth valve V16 for allowing or blocking the flow of an inert gas to the first inert gas supply line 260, a seventeenth valve V17 for allowing or blocking the flow of an inert gas to the second inert gas supply line 270, an eighteenth valve V18 for allowing or blocking the flow of an inert gas to the first bypass line 280, and a nineteenth valve V19 for allowing or blocking the flow of an inert gas to the second bypass line 290.

The gas jungle further includes a cleaning gas supply line 340 connected to at least one of the first and second reaction gas supply lines 220 and 240, in order to clean the reactor 100. In this embodiment, the cleaning gas supply line 340 allows a cleaning gas from the cleaning gas supply portion 330 to flow to the reactor 100 via the first reaction gas supply line 220.

The cleaning gas supply line 340 includes a twenty-first valve V21 for allowing or blocking the flow of a supplied cleaning gas, a cleaning gas MFC 342 for controlling the flow of a cleaning gas passed through the twenty-first valve V21, and a twenty-second valve V22 for allowing or blocking the flow of a cleaning gas controlled by the cleaning gas MFC 342.

The reactor 100, the first and second bypass lines 280 and 290 and the cleaning gas supply line 340 are connected to the exhaust line 400. A throttle valve TV controlled by the internal pressure of the reactor 100 measured by the pressure measuring portion 160, for controlling the amount of an exhausted gas, is installed on the exhaust line 400. Twenty-third, twenty-fourth and twenty-fifth valves V23, V24 and V25 for allowing or blocking the flow of an exhausted gas are also installed on the exhaust line 400. Here, the first bypass line 280 is connected to the line between the twenty-third and twenty-fourth valves V23 and V24, and the second bypass line 290 is connected to the line between the twenty-fifth valve V25 and the exhaust pump 410.

In this gas jungle, a cold spot due to undesired condensation occurring when a reaction gas flows may be formed. Since a cold spot badly affects the process for depositing a thin film, heaters (not shown) for preventing generation of a cold spot are installed on the lines. Preferably, the heaters are independently installed at as many areas as possible along lines, and a temperature gradient is formed along each line. In this embodiment, the temperature gradient is established to be within a range of 40 to 200° C. toward the reactor 100.

In the operation of the first embodiment of an ALD thin film deposition apparatus having such a structure, $TiCl_4$ is used as a first reaction gas, $NH_3$ is used as a second reaction gas, and Ar is used as an inert gas. Thus, liquid $TiCl_4$ is contained in the bubbler 211.

Figure 7:
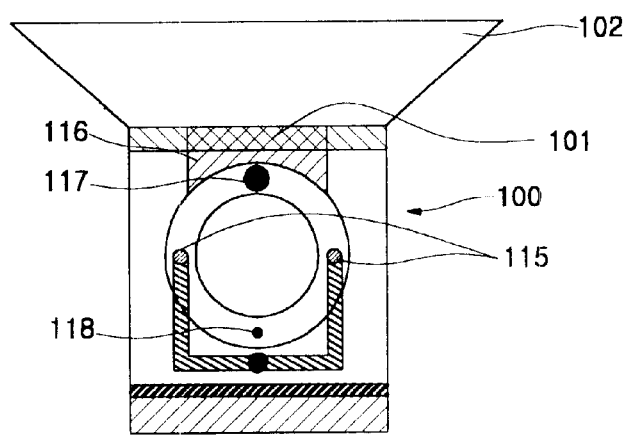
FIG. 7 shows a reactor combined with a transfer module through a vat valve.

The reactor 100 is combined with a transfer module 102 for supplying and transferring a wafer w, via a vat valve 101, as shown in FIG. 7. The wafer w is transferred into the reactor 100 via a wafer transfer hole 116 using a robot arm (not shown) of the transfer module 102, and seated on the wafer block 140.

When the wafer w is seated on the wafer block 140, the temperature of the wafer block 140 increases within a range of 425 to 650° C., so that the temperature of the wafer w is increased to 400 to 600° C. After the wafer temperature is stabilized, the step of introducing a gas into the reactor 100 is performed.

The gas introducing step starts by opening the first valve V1, the sixth valve V6, the eighth valve V8, and the fourth valve V4 for several seconds. Then, a bubbled $TiCl_4$ gas is filled up to the second valve V2, and Ar gas is filled up to the seventh and ninth valves V7 and V9 after its amount is appropriately controlled by the first and second inert gas MFCs 262 and 272. An NH3 gas is filled up to the fifth valve V5 after its amount is appropriately controlled by the second reaction gas MFC 232.

Next, an inert gas is flowed into the reactor 100 through the seventh and ninth valves V7 and V9. Before a gas is introduced, the internal pressure of the reactor 100 is kept at $10^{-4} \sim 5 \times 10^{-3}$ torr. However, as an inert gas is introduced, the internal pressure of the reactor 100 is 1 to 10 torr. This pressure is obtained by the pressure measuring portion 160 installed in the reactor 100 appropriately opening the throttle valve TV of the exhaust line 400. Here, the reason why the seventh and ninth valves V7 and V9 are opened after the sixth and eighth valves V6 and V8 are opened is that the gas within the reactor 100 may flow backward through the seventh and ninth valves V7 and V9 when they are suddenly opened.

The gas introducing step is followed by a step of preventing particles from being generated during deposition of a thin film. Particles produced during deposition of a thin film deteriorate the quality of a thin film, so the particle generation preventing step is very important. This step is performed by opening the fifth valve V5 at least several seconds before a $TiCl_4$ gas is flowed into the reactor 100, while an Ar gas is continuously flowed into the reactor 100, and introducing an $NH_3$ gas into the reactor 100.

If a $TiCl_4$ gas is introduced into the reactor 100 before an $NH_3$ gas is introduced, part of the $TiCl_4$ gas reacts to the surface of the diffusion plate 130, which generates particles as byproducts. At this time, the particle generation preventing step is performed as described above. Particles may be very fine particles of a $TiN_xCl_y$ layer deposited on the diffusion plate 130 or the material Al of the diffusion plate.

Accordingly, in order to prevent particles from being generated from the surface of the diffusion plate 130, an $NH_3$ gas is introduced several seconds before an $TiCl_4$ gas is introduced, so that an $NH_3$ layer is formed on the surface of the diffusion plate 130. The $NH_3$ layer on the diffusion plate 130 reacts to a $TiCl_4$ gas which is introduced during real deposition of a thin film, and the $TiCl_4$ gas is prevented from generating particles from the surface of the diffusion plate 130.

The generation of fine particles is prevented by the principle that a $TiCl_4$ gas reacts to an $NH_3$ layer previously formed on the diffusion plate 130 and thus changes to an HCl vapor to be described later, so that the $TiCl_4$ gas is prevented from reacting to the surface of the diffusion plate 130 or instantaneously etching the same. The vapor byproducts are immediately exhausted via the exhaust line 400 to the outside. A series of reactions occurring within the reactor 110 may be expressed as in the following chemical formula: 2NH3+TiCl4→TiN(s)+4HCl(g)+H2(g)+0.5N2(g).

After the particle generation preventing step, a TiN thin film is really deposited on a wafer w by controlling the flow of a $TiCl_4$ gas and an $NH_3$ gas into the reactor 100.

Deposition of a thin film is performed by alternately introducing a $TiCl_4$ gas and an $NH_3$ gas into the reactor 100. It doesn't matter which gas is introduced first. For example, when a $TiCl_4$ gas is introduced first, a $TiCl_4$ gas and an Ar gas are first introduced into the reactor, in the first step. After a predetermined period of time, the $TiCl_4$ gas is excluded. Thus, a $TiCl_4$ layer is formed on the wafer w, and compressed by an Ar gas which is continuously introduced.

In the second step, an $NH_3$ gas and an Ar gas are introduced together. The supply of the $NH_3$ gas is blocked for a predetermined period of time. The $NH_3$ gas reacts to the $TiCl_4$ layer previously formed on the wafer w, thereby forming a TiN thin film on the wafer w. That is, a TiN+$NH_3$ layer is formed by the consecutive first and second steps.

Next, the first step is again performed to continuously grow a thin film on the TiN+$NH_3$ layer. Then, the TiN+$NH_3$ layer is changed to a TiN+TiN+$TiCl_4$ layer. Thereafter, the second step is performed to form a TiN+TiN+TiN+$NH_3$ layer. A TiN thin film having a desired thickness can be obtained by repeating this process.

This TiN thin film deposition process is performed by alternately opening and closing the third and fifth valves V3 and V5 in a state where the first and fourth valves V1 and V4 are always open, while an Ar gas is continuously introduced into the reactor 100 by opening the sixth, seventh, eighth and ninth valves V6, V7, V8 and V9.

Here, the second valve V2 is opened before the third valve V3, so that a $TiCl_4$ gas passes through the first reaction gas MFC 212 and is filled up to the third valve V3. Thereafter, when the third valve V3 is opened to send a first reaction gas to the reactor 100, the second valve V2 is closed. That is, a first reaction gas passes through the first reaction gas supply line 220 in units of valves. A process byproduct gas generated during reaction is exhausted via the throttle valve TV of the exhaust line 400, and the twenty-third, twenty-fourth and twenty-fifth valves V23, V24 and V25.

To sum up the above-described reaction, a $TiCl_4$ gas flows to the first reaction gas supply line 220 via the third valve V3 after its flow is controlled by the first and second valves V1 and V2, and an Ar gas is controlled in its flow, passes through the seventh valve V7, is mixed with the $TiCl_4$ gas on the first reaction gas supply line 220, and flows to the reactor 100.

Thereafter, a mixture of $TiCl_4$ and Ar pass through the first connection pipe 111 and the first connection line 121, is evenly mixed once more in the first mixing portion 134, and is evenly sprayed over the wafer w through the spray holes 131. An NH$_3$ reaction gas is controlled in its flow through the fourth valve V4, and then flows to the second reaction gas supply line 240 via the fifth valve V5. An Ar gas is controlled in its flow, passes through the ninth valve V9, is mixed with an NH$_3$ gas on the second reaction gas supply line 240, and then flows to the reactor 100. Next, a mixture of NH$_3$ and Ar pass through the second connection pipe 112 and the second connection line 122, is evenly mixed once more in the second mixing portion 135, and is sprayed toward the inner sidewall of the reactor block 110 through the nozzles 133.

Here, it is preferable that the flow of a TiCl$_4$ gas is 1SCCM or more, the flow of an Ar gas to be mixed with a TiCl$_4$ gas is 50SCCM or more, the flow of NH$_3$ is 50SCCM or more, and the flow of an Ar gas to be mixed with an NH$_3$ gas is 60SCCM or more. These values are obtained by several experiments. When the flow rates are at least as described above, a thin film having a high purity, an excellent electrical property, and a good step coverage can be obtained.

In this embodiment, an NH$_3$ gas is introduced at least one second after a TiCl$_4$ gas is excluded.

Also, a duration when a TiCl$_4$ gas and an inert gas are introduced into the reactor 100, and a duration when the TiCl$_4$ gas is excluded before an NH$_3$ gas is flowed into the reactor 100, are at a ratio of 1 to 1.2 or greater.

The ratio of the flow of an inert gas introduced via the first inert gas supply line 260 to the flow of an inert gas introduced via the second inert gas supply line 270 is set to be 1 to 1.2 or greater, in order to prevent a strongly-diffusible TiCl$_4$ gas from flowing backward via the second reaction gas supply line 240.

This thin film deposition is achieved by consecutive gas spraying to the reactor 100, and the process pressure of the reactor is maintained constant by an appropriate signal exchange and control between a pressure measuring portion and valves including a throttle valve. Therefore, the uniformity of a deposited thin film is improved.

While a TiN thin film is deposited on a wafer, Cl can be contained in the thin film. Since Cl deteriorates the purity and electrical characteristics of a thin film, a Cl removing step is also important. The Cl removing step is performed by closing the third valve V3 to prevent introduction of a TiCl$_4$ gas, and opening the sixth and seventh valves V6 and V7, the eighth and ninth valves V8 and V9, and the fourth and fifth valves V4 and V5. That is, only an Ar gas and an NH$_3$ gas are supplied to the reactor 100. Then, an NH$_3$ gas reacts to Cl within the TiN thin film formed on the wafer, thereby producing an HCl. The HCl is exhausted to the outside. This Cl removing step can be omitted when the content of Cl in a thin film is sufficiently low.

Even when a compound gas containing Ta is used as a first reaction gas, and a compound gas containing N, for example, an NH$_3$ gas, is used as a second reaction gas, a TaN thin film can be deposited on a wafer by the method described above.

Figure 8:
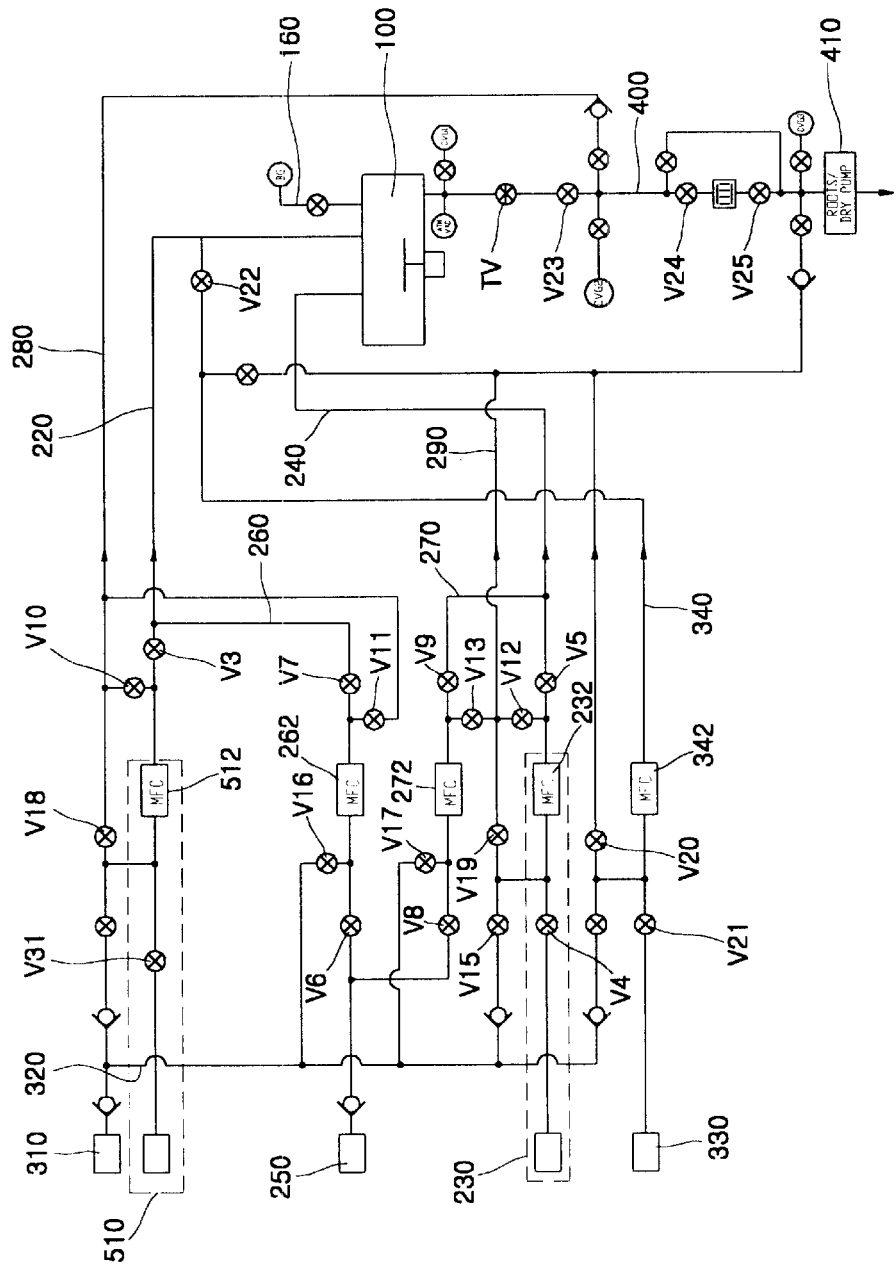
FIG. 8 is a cross-sectional view of an ALD thin film deposition apparatus according to a second embodiment of the present invention.

A second embodiment of an ALD thin film deposition apparatus according to the present invention will now be described with reference to FIG. 8. The same reference numerals as those in FIG. 1 denote the same elements.

In contrast to the first embodiment in which a TiN or TaN thin film can be deposited on a wafer, a thin film such as a WN thin film can be formed in the second embodiment. In order to achieve the second embodiment, the first reaction gas supply portion 210 in the first embodiment is replaced with a first reaction gas supply portion 510. The first reaction gas supply portion 510 includes a thirty-first valve V31 of allowing or blocking the flow of a first reaction gas, and a first reaction gas MFC 512 for controlling the flow of a first reaction gas which has passed through the thirty-first valve V31. The first reaction gas supply portion 510 is connected to the third valve V3. WF6 is used as the material of a first reaction gas, a compound gas containing N, for example, an NH$_3$ gas, is used as a second reaction gas, and an Ar gas is used as an inert gas.

Deposition of a WN thin film is performed by alternately introducing an NH$_3$ gas and a WF$_6$ gas into the reactor 100. For example, when a WF6 gas is first introduced, an Ar gas is introduced together, and the WF6 gas is excluded for a predetermined period of time, in the first step. Then, a WF6 layer is formed on the wafer, and is compressed by an Ar gas which is continuously introduced. In the second step, an NH$_3$ gas and an Ar gas are introduced together, and the flow of an NH$_3$ gas is stopped for a predetermined period of time. The NH$_3$ gas reacts to the WF6 layer formed on the wafer, thereby forming a WN thin film on the wafer. That is, a WN+NH$_3$ layer is formed by consecutive first and second steps.

Next, the first step is again performed to continuously grow a thin film on the WN+NH$_3$ layer. Then, the WN+NH$_3$ layer is changed to a WN+WN+WF6 layer. Thereafter, the second step is performed to form a WN+WN+WN+NH$_3$ layer. Therefore, a WN thin film having a desired thickness can be obtained by repeating this process.

Figure 9:
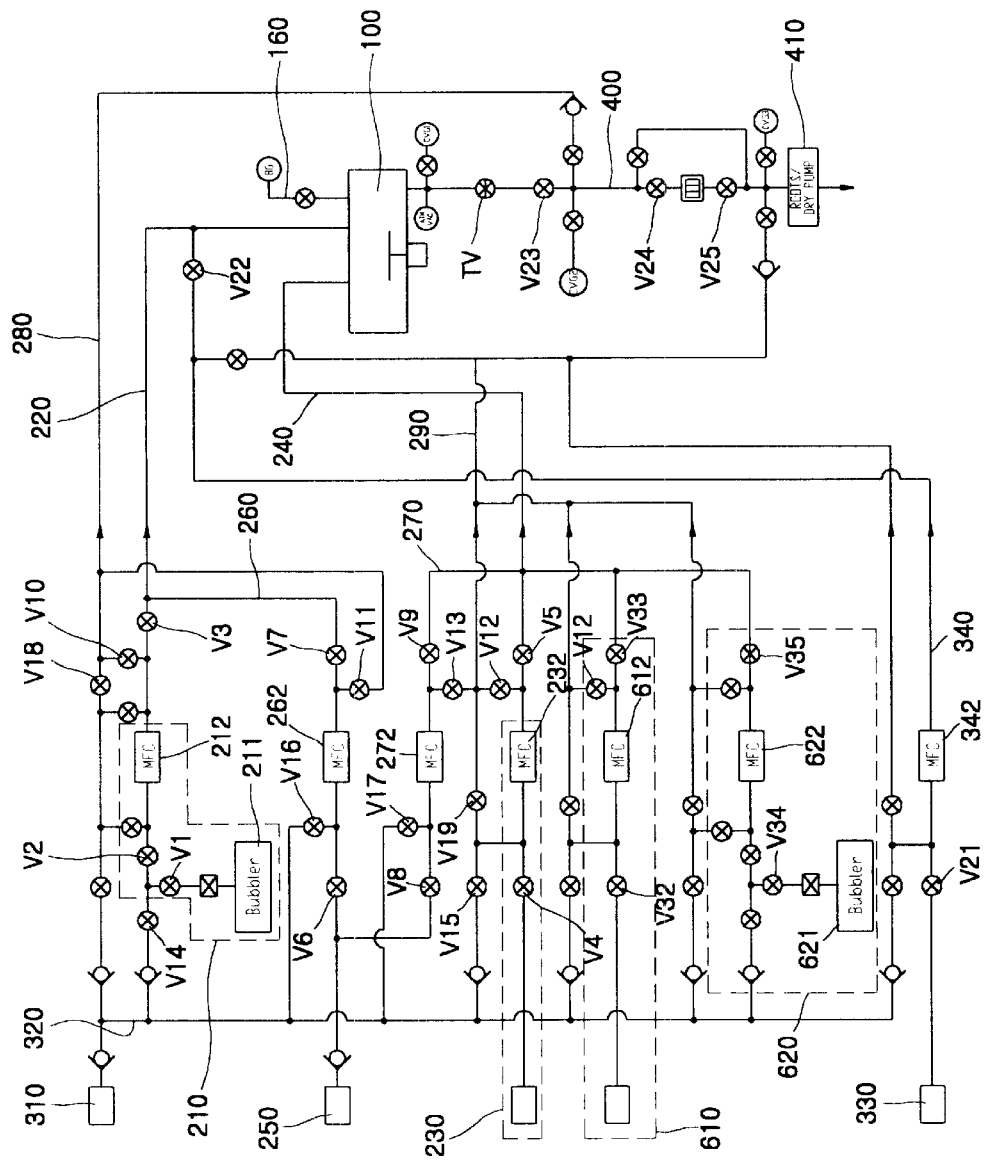
FIG. 9 is a cross-sectional view of an ALD thin film deposition apparatus according to a third embodiment of the present invention.

A third embodiment of an ALD thin film deposition apparatus according to the present invention will now be described with reference to FIG. 9. The same reference numerals as those in FIG. 1 denote the same elements.

In contrast to the first embodiment in which a TiN or TaN thin film can be deposited on a wafer, a thin film such as a Ti or TiAlN film as well as a TiN or TaN film can be formed in the third embodiment. In order to achieve this, the third embodiment further includes a third reaction gas supply portion 620 for supplying a third reaction gas TriMethylAluminum (TMA) to the second reaction gas supply line 240, and a fourth reaction gas supply portion 610 for supplying a fourth reaction gas H2 to the second reaction gas supply line 240.

The fourth reaction gas supply portion 610 includes a thirty second valve V32 for allowing or blocking the flow of supplied H2, a fourth reaction gas MFC 612 for controlling the flow of H2 which has passed through the thirty second valve V32, and a thirty third valve V33 for allowing or blocking the flow of H2 controlled by the fourth reaction gas MFC 612.

The third reaction gas supply portion 620 includes a bubbler 621 for gasifying a third reaction material, a third reaction gas MFC 622 for controlling the flow of a third reaction gas, a thirty fourth valve V34 installed on the line between the bubbler 621 and the third reaction gas MFC 622 for allowing or blocking the flow of the third reaction gas, and a thirty fifth valve V35 for allowing or blocking the flow of the third reaction gas, which has been controlled by the third reaction gas MFC 622, to the second reaction gas supply line 240.

That is, in this structure, a compound gas containing a transfer metal element Ti or Ta is used as a first reaction gas, an Ar gas is used as an inert gas, a TMA gas is used as a third reaction gas, and an H2 gas is used as a fourth reaction gas.

The third embodiment of the thin film deposition apparatus having such a configuration is almost the same as the first embodiment, so it will not be described in detail.

In all of the embodiments described above, a TiCl$_4$ gas or a compound gas containing a transfer metal element such as Ti, Ta or W is used as a first reaction gas. However, other gases can be used as the first reaction gas. Other gases such as He or N$_2$ instead of Ar gas can be used as an inert gas. Also, other compound gases including N, instead of an NH$_3$ gas, can be used as a second reaction gas.

In the first, second and third embodiments of an ALD thin film deposition apparatus according to the present invention, as to first and second reaction gases that have a major role in a thin film deposition process, a mixture of a first reaction gas an inert gas is sprayed onto a wafer, and a mixture of an NH$_3$ gas and an inert gas is sprayed toward the inner sidewall of a reactor block. The interval between a diffusion plate and a wafer block is narrowed to about 20 to 50 mm, so that several reaction gases react to each other while being sequentially compressed down on the wafer. Therefore, a Ti, TiAlN, TiN, TaN or WN film having high purity, excellent electrical characteristics, and a good step coverage can be deposited.

Also, an NH3 gas is sprayed to a reactor several seconds before a first reaction gas is sprayed thereto, so that generation of particles can be prevented.

Furthermore, an NH3 gas is sprayed to a reactor 100 after deposition of a thin film is completed, or during deposition, so that Cl existing within the thin film can be removed. Thus, the electrical characteristics of the thin film can be improved.

What is claimed is:

1. An atomic layer deposition (ALD) thin film deposition apparatus comprising:
   a reactor in which a wafer is mounted and a thin film is deposited on the wafer;
   a first reaction gas supply portion for supplying a first reaction gas to the reactor;
   a second reaction gas supply portion for supplying a second reaction gas to the reactor;
   a first reaction gas supply line for connecting the first reaction gas supply portion to the reactor;
   a second reaction gas supply line for connecting the second reaction gas supply portion to the reactor;
   a first inert gas supply line for supplying an inert gas from an inert gas supply source to the first reaction gas supply line;
   a second inert gas supply line for supplying the inert gas from the inert gas supply source to the second reaction gas supply line; and
   an exhaust line for exhausting the gas from the reactor;
   wherein the reactor comprises a first connection line for supplying the first reaction gas and/or the inert gas to the wafer through a plurality of spray holes, and a second connection line for supplying the second reaction gas and/or the inert gas to the wafer through a plurality of nozzles such that the first and second reaction gases are alternatively supplied to the reactor, while the inert gas is continuously supplied to the reactor.

2. The ALD thin film deposition apparatus of claim 1, wherein the first reaction gas supply portion comprises:
   a first bubbler for gasifying a first reaction material to form the first reaction gas;
   a first reaction gas mass flow controller for controlling the flow of the first reaction gas supplied from the first bubbler; and
   a first valve installed on a line between the first bubbler and the first reaction gas mass flow controller for allowing or blocking the flow of the first reaction gas.

3. The ALD thin film deposition apparatus of claim 2, further comprising a second valve installed on the first reaction gas supply line for allowing or blocking the flow of the first reaction gas controlled by the first reaction gas mass flow controller.

4. The ALD thin film deposition apparatus of claim 1, wherein the second reaction gas supply portion comprises:
   a third valve for allowing or blocking the flow of the second reaction gas; and
   a second reaction gas mass flow controller for controlling the flow of the second reaction gas which has passed through the third valve.

5. The ALD thin film deposition apparatus of claim 4, further comprising a fourth valve installed on the second reaction gas supply line for allowing or blocking the flow of the second reaction gas controlled by the second reaction gas mass flow controller.

6. The ALD thin film deposition apparatus of claim 1, wherein the first inert gas supply line comprises a fifth valve for allowing or blocking the flow of a supplied inert gas, a first inert gas mass flow controller for controlling the flow of the inert gas which has passed through the fifth valve, and a sixth valve for allowing or blocking the flow of the inert gas which has been controlled by the first inert gas mass flow controller.

7. The ALD thin film deposition apparatus of claim 1, wherein the second inert gas supply line comprises an seventh valve for allowing or blocking the flow of a supplied inert gas, a second inert gas mass flow controller for controlling the flow of the inert gas which has passed through the seventh valve, and a eighth valve for allowing or blocking the flow of the inert gas which has been controlled by the second inert gas mass flow controller.

8. The ALD thin film deposition apparatus of claim 1, further comprising:
   a first bypass line for allowing the first reaction gas and/or inert gas to flow directly to the exhaust line without passing through the reactor, the first bypass line having a ninth valve for allowing or blocking the flow of the first reaction gas to the exhaust line and an tenth valve for allowing or blocking the flow of the inert gas to the exhaust line; and
   a second bypass line for allowing the second reaction gas and/or inert gas to flow directly to the exhaust line without passing through the reactor, the second bypass line having a eleventh valve for allowing or blocking the flow of the second reaction gas to the exhaust line and a twelfth valve for allowing or blocking the flow of the inert gas to the exhaust line.

9. The ALD thin film deposition apparatus of claim 8, further comprising a separate inert gas supply line for purging and exhausting the gas and/or contaminating sources existing within lines, wherein the separate inert gas supply line is organically connected to the first and second reaction gas supply portions, the first and second inert gas supply lines, the first and second bypass lines, and the exhaust line.

10. The ALD thin film deposition apparatus of claim 1, wherein the first reaction gas is a TiCl$_4$ gas or a compound gas containing Ta, and the second reaction gas is NH$_3$.

11. The ALD thin film deposition apparatus of claim 1, wherein the first reaction gas supply portion comprises:
   a thirteenth valve for allowing or blocking the flow of the first reaction gas; and
   a third reaction gas mass flow controller for controlling the flow of the first reaction gas which has passed through the thirteenth valve.

12. The ALD thin film deposition apparatus of claim 11, wherein the first reaction gas is $WF_6$, and the second reaction gas is $NH_3$.

13. The ALD thin film deposition apparatus of claim 1, further comprising:
- a third reaction supply portion for supplying a third reaction gas to the second reaction gas supply line; and
- a fourth reaction supply portion for supplying a fourth reaction gas to the second reaction gas supply line,
- wherein the fourth reaction gas supply portion has a fourteenth valve for allowing or blocking the flow of a fourth reaction gas, a fourth reaction gas mass flow controller for controlling the flow of a fourth gas which has passed through the fourteenth valve, and a fifteenth valve for allowing or blocking the flow of the fourth gas which has been controlled by the fourth reaction gas mass flow controller.

14. The ALD thin film deposition apparatus of claim 13, wherein the third reaction gas supply portion comprises:
- a second bubbler for gasifying a third reaction material to form the third reaction gas;
- a fourth reaction gas mass flow controller for controlling the flow of the third reaction gas supplied from the second bubbler;
- a sixteenth valve installed on a line between the second bubbler and the fourth reaction gas mass flow controller for allowing or blocking the flow of the third reaction gas; and
- a seventeenth valve for allowing or blocking the flow of the third reaction gas, which has been controlled by the fourth reaction gas mass flow controller, to the second reaction gas supply line.

15. The ALD thin film deposition apparatus of claim 14, wherein the first reaction gas is a compound gas containing a transfer metal element selected from the group consisting of Ti, Ta and W, and the second reaction gas is $NH_3$.

16. The ALD thin film deposition apparatus of claim 14, wherein the third reaction gas is TriMethylAluminum (TMA), and the fourth reaction gas is $H_2$.

17. The ALD thin film deposition apparatus of claim 1, wherein the reactor further comprises:
- a reactor block for receiving the wafer;
- a shower head plate covering the reactor block to maintain a predetermined pressure within the reactor block; and
- a diffusion plate installed on the shower head plate, and including the plurality of spray holes which face an upper surface of the wafer to spray the first reaction gas and/or the inert gas onto the wafer, and the plurality of nozzles which extend toward an inner side surface of the reactor block to spray the second reaction gas and/or the inert gas toward edges of the wafer.

18. The ALD thin film deposition apparatus of claim 17, wherein the reactor further comprises:
- a wafer block installed in the reactor block, on which the wafer is to be seated; and
- an exhausting portion connected to the reactor block for exhausting the first and second gases and/or the inert gas from the rector block.

19. The ALD thin film deposition apparatus of claim 17, wherein the reactor further comprises first and second connection pipes connected to the first and the second connection lines, respectively; and
- wherein the first reaction gas and/or the inert gas is sprayed to the wafer through the spray holes along a first route from the first connection pipe to the first connection line, and the second reaction gas and/or the inert gas is sprayed to the edges of the wafer through the nozzles along a second route from the second connection pipe to the second connection line.

* * * * *